(12) United States Patent
Tyne

(10) Patent No.: US 11,852,687 B2
(45) Date of Patent: Dec. 26, 2023

(54) APPARATUS AND ASSOCIATED METHODS FOR LOAD BANK AND POWER GENERATOR CONTROL

(71) Applicant: Shelby Kenneth Campbell Tyne, San Diego, CA (US)

(72) Inventor: Shelby Kenneth Campbell Tyne, San Diego, CA (US)

( * ) Notice: Subject to any disclaimer, the term of this patent is extended or adjusted under 35 U.S.C. 154(b) by 4 days.

(21) Appl. No.: 17/479,414

(22) Filed: Sep. 20, 2021

(65) Prior Publication Data

US 2023/0092180 A1    Mar. 23, 2023

(51) Int. Cl.
| | |
|---|---|
| *G01R 31/34* | (2020.01) |
| *G01R 31/40* | (2020.01) |
| *H02J 3/38* | (2006.01) |
| *H04L 12/40* | (2006.01) |
| *G06F 3/0488* | (2022.01) |

(52) U.S. Cl.
CPC ........... *G01R 31/343* (2013.01); *G01R 31/40* (2013.01); *G06F 3/0488* (2013.01); *H02J 3/381* (2013.01); *H04L 12/40* (2013.01); *H04L 2012/40228* (2013.01)

(58) Field of Classification Search
CPC ..... G01R 31/343; G01R 31/40; G06F 3/0488; H02J 3/381; H04L 12/40; H04L 2012/40228
See application file for complete search history.

(56) References Cited

U.S. PATENT DOCUMENTS

| | | | |
|---|---|---|---|
| 10,840,735 B1 * | 11/2020 | Cooper | H02J 3/32 |
| 2005/0134248 A1 * | 6/2005 | Locker | H02M 5/293 |
| | | | 323/285 |
| 2012/0078578 A1 * | 3/2012 | Piccirillo | G05B 23/0229 |
| | | | 702/185 |
| 2012/0248874 A1 * | 10/2012 | Pan | H02J 11/00 |
| | | | 307/64 |
| 2014/0312711 A1 | 10/2014 | Warlick | |

(Continued)

FOREIGN PATENT DOCUMENTS

| | | | |
|---|---|---|---|
| CN | 103472325 B | * | 3/2016 |
| WO | WO-2022132807 A1 | * | 6/2022 |

OTHER PUBLICATIONS

David Jesberger, "SIGMA Control—The Most Advanced Load Bank Control Solution", ASCO Power Technologies, Jun. 23, 2020 (Year: 2020).*

(Continued)

*Primary Examiner* — Yoshihisa Ishizuka
(74) *Attorney, Agent, or Firm* — ESPLIN & ASSOCIATES, PC

(57) ABSTRACT

Apparatuses and associated methods for load bank and power generator control are described herein. In one aspect, a method for controlling a load bank can include: receiving input via a human-machine interface (HMI) corresponding to setpoints of operation for the load bank; receiving data via a power quality analyzer and corresponding to load bank operating parameters; determining, via the power quality analyzer, whether the load bank is operating according to the setpoints of operation received from the HMI; and generating a set of commands for adjusting the load bank operating parameters based on whether the load bank is operating according to the setpoints of operation.

19 Claims, 7 Drawing Sheets

(56) References Cited

U.S. PATENT DOCUMENTS

| | | | | |
|---|---|---|---|---|
| 2015/0222121 A1* | 8/2015 | Kuttel | ................... | H02J 3/00 |
| | | | | 322/8 |
| 2017/0133847 A1* | 5/2017 | Brown | ................... | H02J 3/14 |
| 2017/0315184 A1* | 11/2017 | Morin | ................... | G01R 31/40 |
| 2017/0370993 A1* | 12/2017 | Weinberg | ............... | G01R 31/40 |
| 2020/0125084 A1* | 4/2020 | Harder | ................... | A47C 9/10 |
| 2023/0041412 A1* | 2/2023 | Kohn | ................... | G06N 20/00 |

OTHER PUBLICATIONS

Neil Rasmussen, "Impact of Leading Power Factor on Data Center Generator Systems", Schneider Electric White Papers 200, Nov. 2015 (Year: 2015).*
Eaton, "Power factor correction: a guide for the plant engineer", Technical Data SA02607001E, Aug. 2014 (Year: 2014).*
John Ware, "Power factor correction", IEE Wiring Matters, Spring 2006 (Year: 2006).*
Brian Tienhaara, "Generator Load Testing", American Generators, Apr. 2015 (Year: 2015).*
Andrea, "Maintainance for Portable Generators: Ultimate Guide", Electric Baron, Dec. 2020 (Year: 2020).*
Damien Olsen, "How to Avoid Wet Stacking in Your Diesel Generator", Energy Management Corporation, Oct. 2020 (Year: 2020).*
Rx Monitoring Services, "Intelligent load bank", User Manual, Sep. 2020 (Year: 2020).*

* cited by examiner

APPARATUS AND ASSOCIATED METHODS FOR LOAD BANK AND POWER GENERATOR CONTROL

FIELD

The invention described herein related to load banks and power generators, and in particular, apparatuses and associated methods for controlling load banks and power generators.

BACKGROUND OF THE INVENTION

Load banks are testing devices that can set desired resistive loads that can be applied to a coupled electrical power source, such as electrical power generators, electrical engines, and the like. The applied resistive loads can imitate operational loads placed on the coupled power source when the power source is operational. The load bank can convert and dissipate the power output of the power source, and can monitor the operational parameters of the power source while doing so. Further, as the load bank can control the load across experienced by the power source, varying conditions can be applied to the power source to simulate different scenarios or environments. The monitoring of operational parameters of the power source while under load can be useful in the testing and optimizing of the power source when in actual use.

However, adjusting the load that a load bank applies to a coupled power source can be time consuming, tedious, and inaccurate, as such changes involve either the manual insertion or extraction of one or more resistors into an existing resistor network, or manual input into a human-machine interface every time load is to be initiated or adjusted. Hence, such load banks typically require adjusting a load in steps and therefore are limited as to the type of load changes that can be made during the testing procedure as well as the amount of load that can be changed. In addition, while controls can be provided for configuring the load bank to the appropriate load, there is typically little or no ability to provide other control inputs to a load bank from remotely, or have the load bank automatically initiate or adjust load bank configurations or schedules. Also, many such load banks are not easily modified to operate with external equipment, and further are not easily upgraded (e.g., to include additional or fewer resistors).

Further, the identification and implementation of maintenance requirements for power sources is typically a difficult process. For example, some power generators or engines can include one or more fuel filters encased within the motor. The fuel filter can become gradually clogged with particles formed or carried in the fuel, which can adversely affect the performance of generator or engine. A typical maintenance procedure for improving the fuel filter performance is to either replace the filter, or to run the generator or engine through a maintenance process, where the engine runs at particular operational parameters to produce a high enough temperature within the generator or engine to cause the particulates trapped by the fuel filter to burn off. However, these maintenance processes require the generator or engine to shut down for an extended period of time, which can reduce overall efficiency for the generator or motor. This can be compounded particularly for those generators or engines that are not in a permanently static location, such as engines for heavy construction vehicles like bulldozers and cranes, as it is often difficult to use a load bank to monitor performance parameters for the generator or load bank.

SUMMARY

Apparatuses and associated methods for load bank and power generator control are described herein. In one aspect, a method for controlling a load bank can include: receiving input via a human-machine interface (HMI) corresponding to setpoints of operation for the load bank; receiving data via a power quality analyzer and corresponding to load bank operating parameters; determining, via the power quality analyzer, whether the load bank is operating according to the setpoints of operation received from the HMI; and generating a set of commands for adjusting the load bank operating parameters based on whether the load bank is operating according to the setpoints of operation.

This aspect can include a variety of embodiments. In one embodiment, the received input can include a selection for an automatic generator loading mode. In some cases, the received input further includes a load type, a number of increments for increasing or decreasing a load type, a time span for increasing or decreasing a load type, or a combination thereof. In some cases, the method can further include: monitoring, subsequent to the generating the set of commands, a set of bus power levels and a total demand level for a predefined period of time; and powering down the power quality analyzer if the set of bus power levels does not decrease. In some cases, the method can further include powering the power quality analyzer after identifying a decrease in the total power level that exceeds a minimum power level threshold.

In another embodiment, the received input can include a selection for a load-chase mode. In some cases, the received input further can include a power factor (PF) level, a reactance level, or a resistance level. In some cases, the method can further include calculating a load value based on the received input, and applying the calculated load on a preset interval. In some cases, the method can further include adjusting a bus power factor level for implementing a lagging power factor according to the received user input.

In another embodiment, the received input can include a selection of a capacitive mode. In some cases, the method can further include adjusting a capacitive value of the load bank for power conditioning a lagging power factor value.

In another embodiment, the received input can include a selection of a timed mode. In some cases, the set of commands can include a set of power loads to be implemented by the load bank at predefined time intervals and in a predetermined order.

In another embodiment, the received user input can include a simulated failure mode. In some cases, the method can further include identifying points of failure of the load bank based on the generated set of commands. In some cases, the generated set of commands include an inductive load value, a capacitive load value, a resistive load value, or a combination thereof.

In another embodiment, the load bank supplies a power load to a data center, a hospital, a wind farm, a photovoltaic farm, a utility provider, a municipal building, or a combination thereof.

In another embodiment, the power quality analyzer communicates with the load bank via a MODBUS protocol.

In another aspect, a load bank module for controlling a load bank can include a HMI configured to receive input corresponding to setpoints of operation for the load bank; and a power quality analyzer in electronic communication with the HMI and the load bank, wherein the power quality analyzer is adapted and configured to: determine whether the load bank is operating according to the setpoints of operation received via the HMI; and generate a set of commands for adjusting the load bank operating parameters based on the determining.

In another aspect, a method for performing maintenance on a power generator can include: monitoring, a via a load bank module, a set of load parameters values of the power generator; identifying, via the load bank module, when at least one of the load parameter values falls below a maintenance threshold; and activating, via the load bank module, a maintenance procedure based on the identifying.

This aspect can include a variety of embodiments. In one embodiment, the method can further include receiving, at the load bank module, identification information of the power generator; and determining the maintenance threshold from the identification information.

In another embodiment, the maintenance threshold can include an efficiency percentage of the at least one of the load parameter values.

In another embodiment, the maintenance procedure can include a cleaning procedure of a fuel filter.

In another embodiment, the power generator continues to operate while simultaneously implementing the maintenance procedure.

In another embodiment, the power generator operates a construction vehicle.

BRIEF DESCRIPTION OF THE DRAWINGS

For a fuller understanding of the nature and desired objects of the present invention, reference is made to the following detailed description taken in conjunction with the accompanying drawing figures wherein like reference characters denote corresponding parts throughout the several views.

DETAILED DESCRIPTION OF THE INVENTION

Load bank modules for controlling load banks are described herein. The load bank module can be coupled to a load bank, such as a Crestchic load bank (resistive, reactive, and the like). The load bank module can utilize the EMCP 4.2 GCP MODBUS communication protocol for communicating with the load bank. The load bank module can activate various load bank procedures for testing the operational status of power generators and power devices coupled to the load bank. In some cases, the load bank can receive load measurements of coupled power generators/devices both during and not during an activated load bank procedure, and can adjust the activated load bank procedure based on the load measurements, can activate the load bank procedures independently of user input, and can diagnose conditions of coupled power generators/devices from the load bank procedure. Further, the load bank module can communicate wirelessly, thus allowing for remote controlling and communication with the load bank/load bank module.

Figure 1:
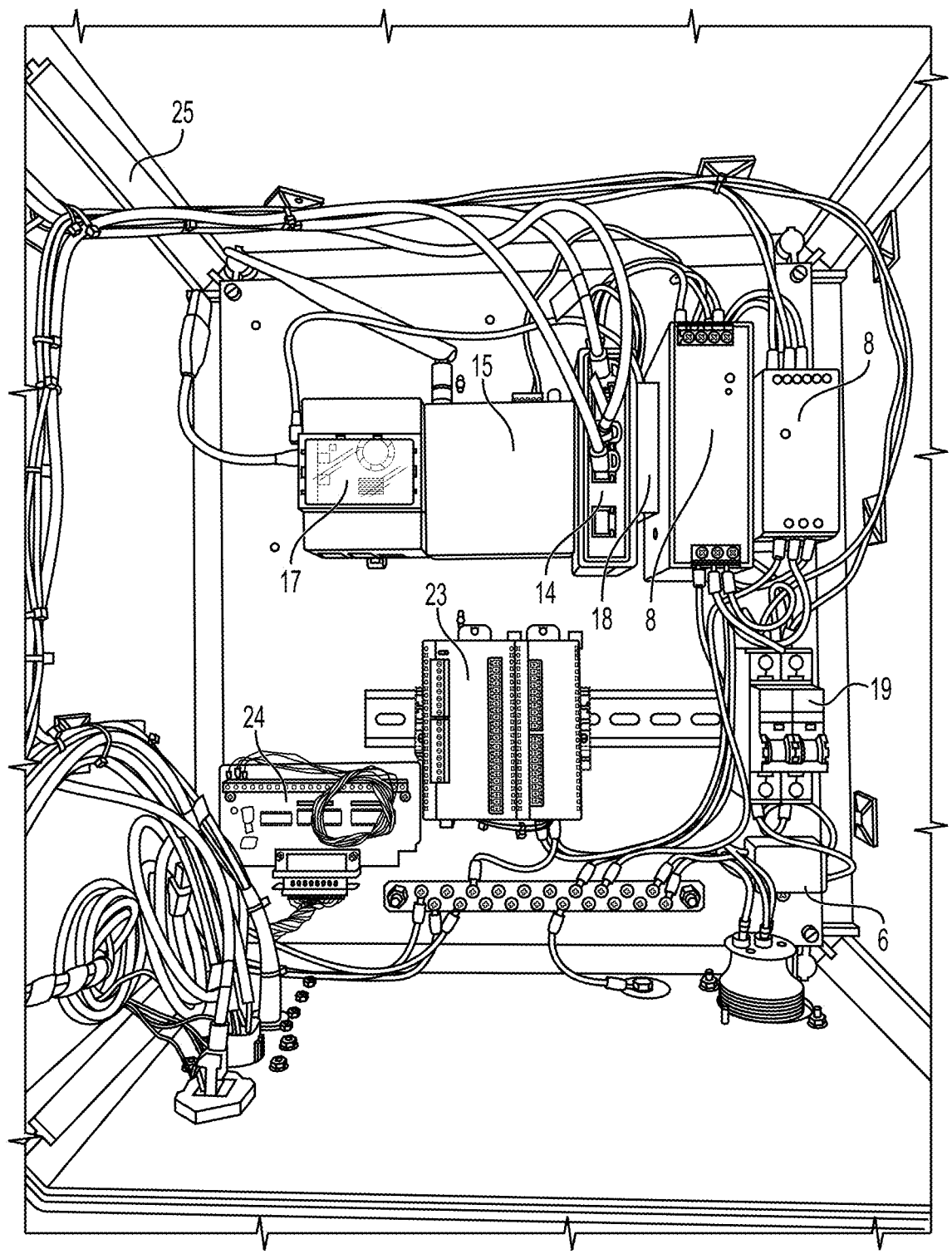
FIG. 1 shows an interior of a load bank module according to an embodiment of the present disclosure.
Figure 2:
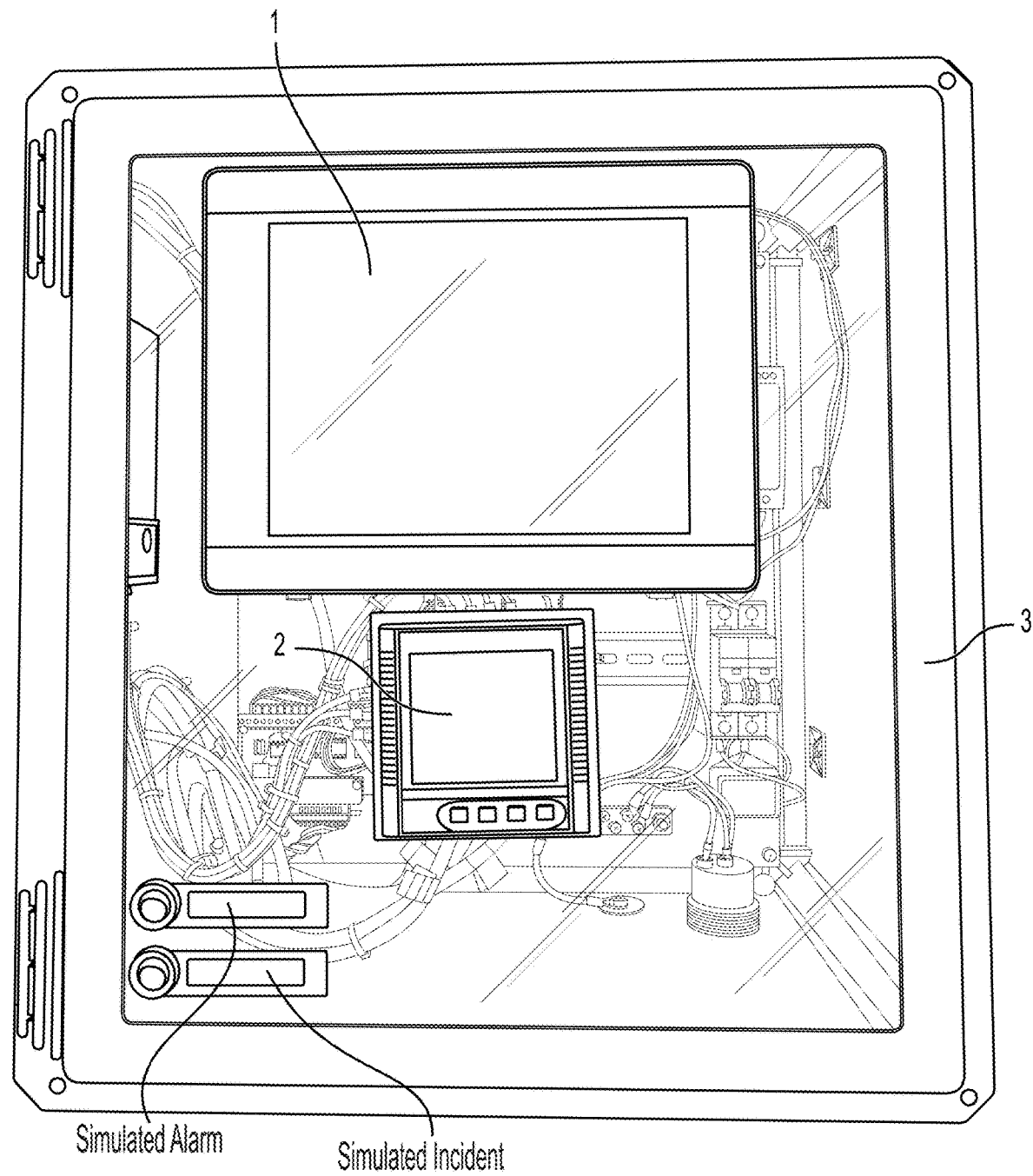
FIG. 2 shows an exterior of a load bank module according to an embodiment of the present disclosure.
Figure 3:
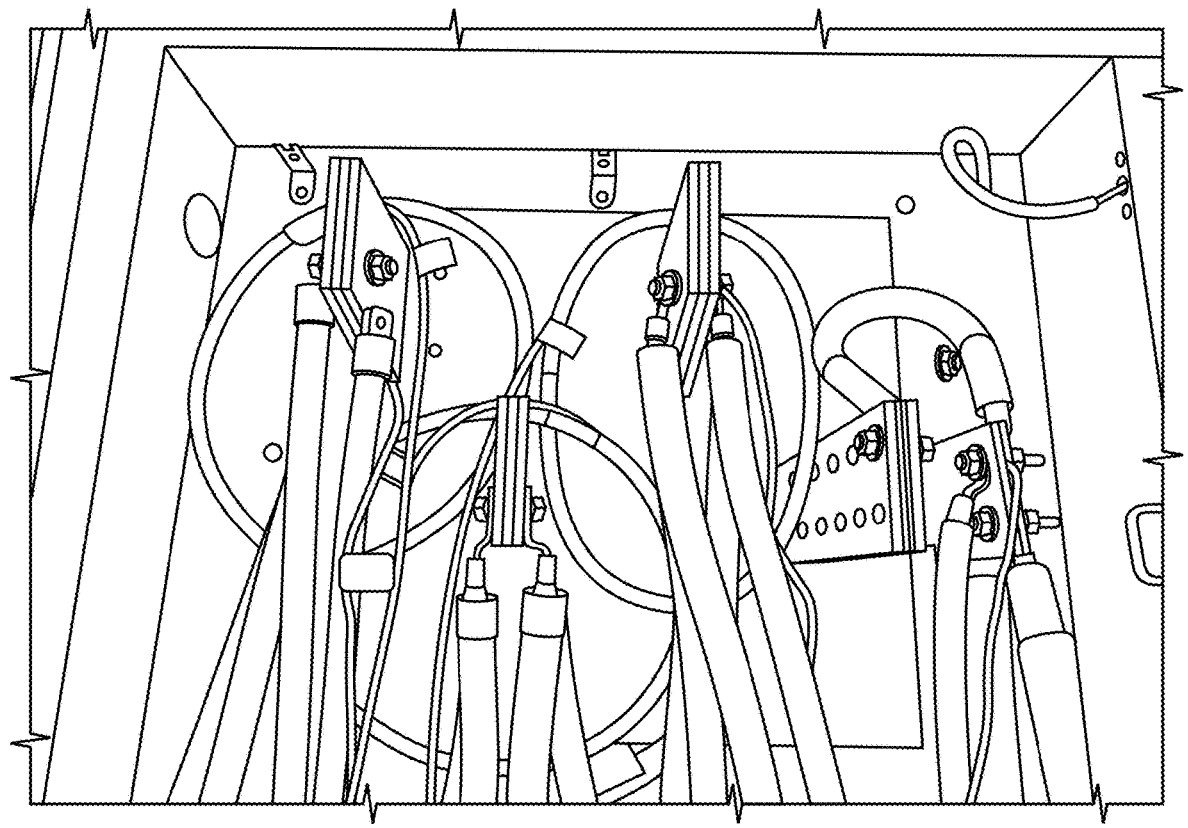
FIG. 3 shows a common busbar load bank power input board for coupling a load bank module according to an embodiment of the present disclosure.

FIGS. 1 and 2 depict images of components of a load bank module according to embodiments of the present disclosure. The load bank module as depicted in FIGS. 1 and 2 can include a variety of components, including a Human Machine interface (HMI) 1, which a user can implement to communicate with the load bank module. The HMI 1 can receive user input for selecting various operational parameters, load bank procedures variables (time periods, load values, ramp-up percentages, and the like), particularly at initial setup. Various screens displayed by the HMI are depicted in FIGS. 4-7.

The load bank module can also include a Power Quality Meter (PM) 2. The PM 2 can receive load value measurements of the coupled load bank and/or of coupled power generators/devices (via the coupled load bank). The PM 2 can also log quality metrics of the load bank and coupled power generators/devices. The PM 2 can also display and transmit values to the SBC 18 for detailed logging, as well as dedicated memory of the PM 2. The SBC 18 can analyze the data received from the PM 2 and adjust the inputs based on a mode selection and parameter input.

The load bank module can also include: an enclosure 3; DIN rail Backing 4; a DIN rail 5; a power filter 6; a transformer (e.g., 480V to 120V and 50 VA, (600V/380V to 220V for 50 Hz countries, and the like)) 7; a power supply (e.g., 24V) 8; a plug for RCT's 9; RCT's (e.g., 1000-6000A) 10, with a 36" window with 6' cables; wire fused power sensing and supply leads 11; an RJ45 jack 12 with cables; sun shade 13 for the HMI; multi-port unmanaged switch (e.g., 24V) 14; a wireless transceiver (e.g., 4G TriBand Dual SIM Wireless VPN Router and Modem 24V and Antenna) 15; a GPS Module 16; a Single board Mini PC (SBC) 17; a stepdown power supply(e.g., 24V-5V) to SBC 18; a multi-phase circuit breaker 19; mounting components (e.g., magnets) 20; receptacle for multi-phase power 21; receptacle for RCT's 22; I/O PLC (e.g., 24V) 23; receptacle and board for Thumbwheel system 24; and CAT6e cords 25.

The load bank module can control a coupled load bank through the MODBUS protocol and PLC control either automatically or manually. The programmable HMI 1 can directly control the load bank. The load bank module gathers data from the load bank and the PM 2 through MODBUS, interprets the gathered data, and reacts accordingly to defined setpoints input into the HMI 1 by the user (e.g., during an initial startup). The load bank module can perform multiple automatic and manual functions. The load bank module can also function as a power quality analyzer that can log and monitor fluctuations of electricity supply in buildings, generator installations amongst other places where the electricity is expended.

Further, the GPS module 16 and wireless transceiver 15 can provide for wireless communications between the load bank module (and load bank) and a user(s). The load bank module can communicate load bank measurements and load bank procedure data to a user (or user system) wirelessly. Further, the load bank module can receive wireless communications from a user (or user system) that can include a set of instructions, communication acknowledgements, and the like.

Figure 4:
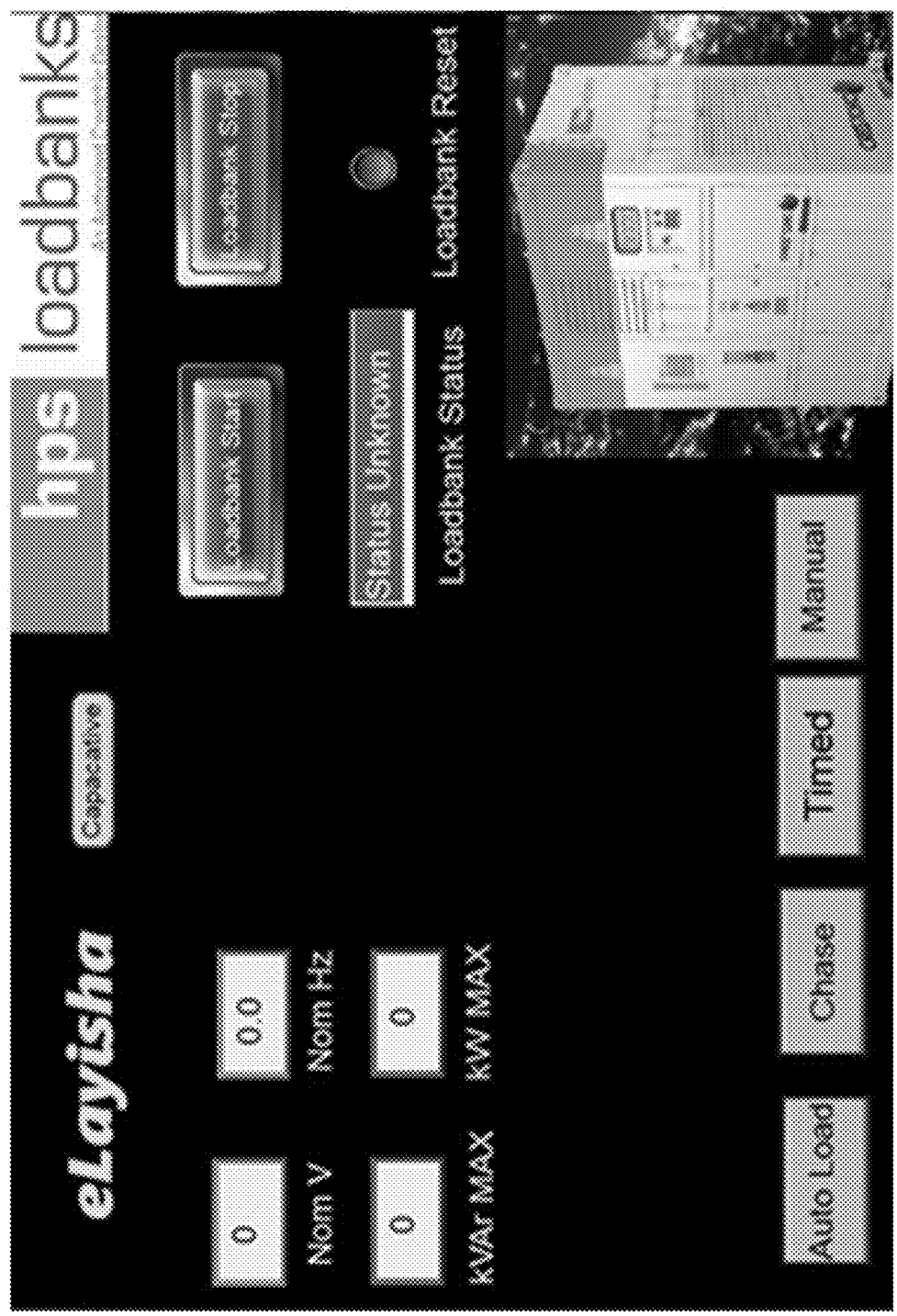
FIGS. 4-7 show graphical user interfaces of a load bank module according to embodiments of the present disclosure.
Figure 5:
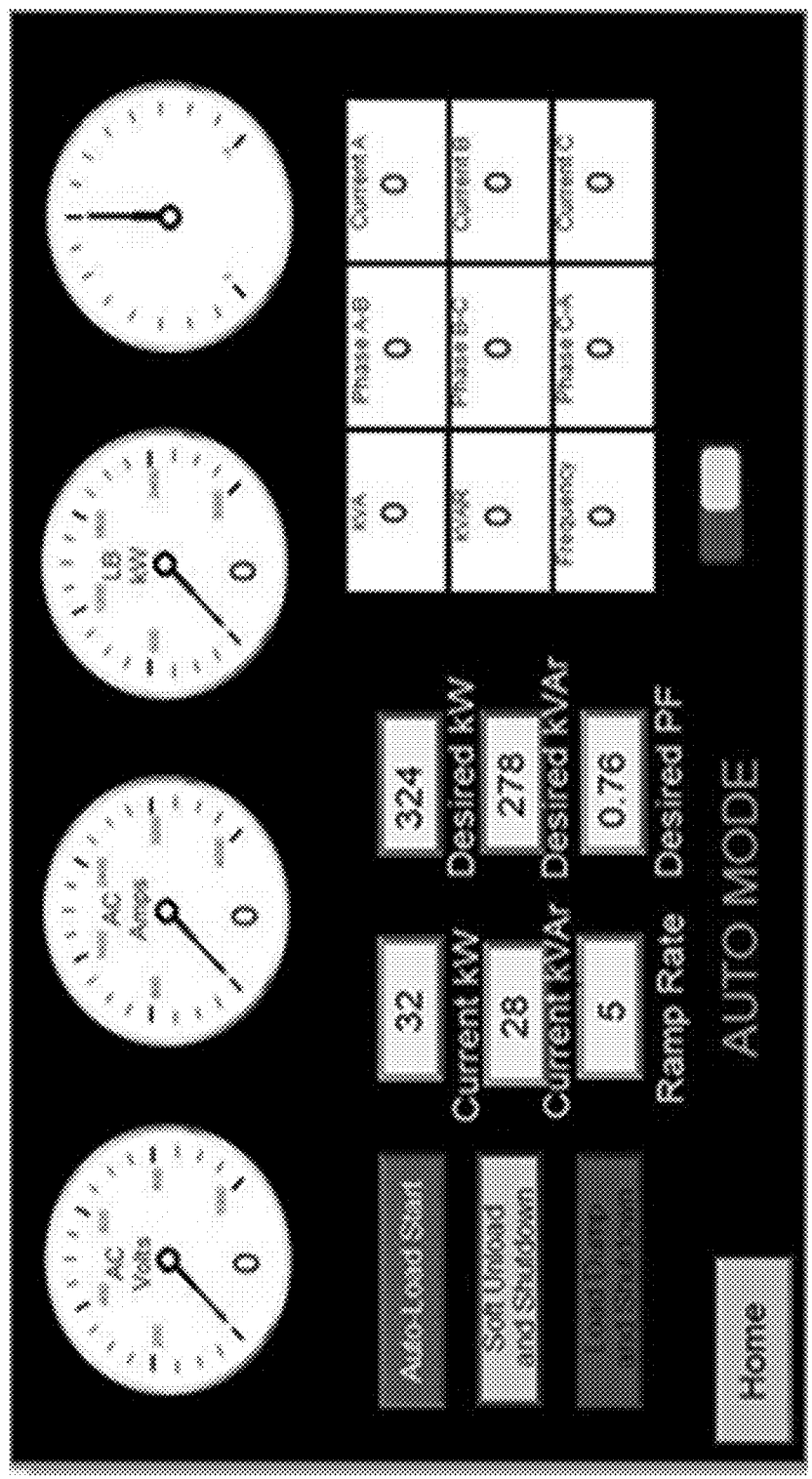

FIG. 4 depicts a startup screen displayed on the HMI 1, for example when power is initiated for the load bank module. The load bank module can perform a variety of load bank procedures, which are explained in more detail below:

Auto-Load Function

The automatic functions of the load bank are performed according to data input at startup of the module. In automatic generator loading mode, any combination of reactive and/or resistive load can be automatically loaded in a number of desired increments (e.g., as selected by the user), over the time desired, and to a desired user set level. The load bank power, power factor and associated values are measured in conjunction and in communication with the power quality meter. The EMCP 2.0 can also send and receive this data, for example if a coupled generating set is being implemented. The load bank module can compute and determine any fluctuation in power demand by the coupled utility/power generation service (PGS) and can automatically adjust load softly or immediately according to the amount of demand read, and the urgency of demand as determined by user input. This function can prevent wet stacking of generators as well as premature unplanned maintenance of emissions equipment attached to the PGS.

Various parameters are prescribed to initiate load shed conditions, such as current adjustment on phases, adjusting load experienced by the bus, an emergency condition from the EMCP 2.0, and the like. The load bank can then monitor bus power and total demand for a predetermined time period (e.g., 4 minutes), upon which if no reduction of bus values are found, the load bank module can then enter a cooldown cycle (e.g., of 4 minutes) and can then shut down. The module can then start up and automatically increases load if a decrease in power is experienced past the minimum power value set by the load bank module and can then initiate the reloading of the load bank to its initial load values.

As an example, a user can select from the startup screen (depicted in FIG. 4), an auto-load mode. The HMI can then display the screen depicted in FIG. 5. First the user can verify active voltage and frequency values on the blocks on the lower left and upper right gauge. The gauge on the upper right displays lagging and leading power (before 12 o'clock indicates lagging and after 12 indicates leading power factor).

The user can then input desired PF and desired kW. The load bank module can automatically calculate the Desired kVAr and the load from the inputted values. The user can then insert the Ramp Rate in Minutes (e.g., 0-10 minutes) and if all procedures have been followed the load bank module can be ready for initiating a load. Once an "Auto-Load Start" action is selected, the load bank module can automatically add and apply load in increments of a predetermined percentage (e.g., 10%) over the total period entered into "Ramp Rate" (e.g., for 5 minutes an ascending load is applied every 30 seconds).

Once the load is at the set load the load bank module can maintain this value indefinitely until an increase in Bus kW is measured or an emergency condition occurs, at which point all artificial load can be shed within a predefined time period (e.g., 30 seconds). The load bank module can continue to monitor the Bus kW for a time period (e.g., 4 minutes), and if no decrease of Bus kW is seen or the emergency condition still exists, the load bank module can enter a cool down cycle of another time period (e.g., 4 minutes), can verify Bus kW again or the emergency condition, and if the values have still not decreased, can shut down and enter a standby mode.

The load bank module can periodically check Bus kW (e.g., in 10 minute intervals) and if the Bus kW has decreased to a predefined level, the load bank module can automatically start and apply the load initially entered by the user.

A "Soft-Unload and Shutdown" action, when implemented, can shed load in percentage increments (e.g., 10%), and during the "Ramp Rate" time period.

A "Load-Dump and Shutdown" action can shed all load immediately and leave the load bank fans running for a predefined cooling period (e.g., 4 minutes).

Load-Chase Function

The load-chase mode can monitor bus power and/or power factor, and determines any adjustments to the power factor (PF), reactance, resistance or a combination of all three values.

The load bank module maintains set values input by the user and can then apply the calculated load on a preset interval. This mode can condition electricity with minimum electrical burden, and can be utilized by data centers, hospitals, photovoltaic and wind farms, utility companies, municipalities and utilized during commissioning of PGS. The load bank module can adjust bus PF to maintain a lagging power factor negating the effects of harmonics and capacitance produced by data equipment.

Figure 6:
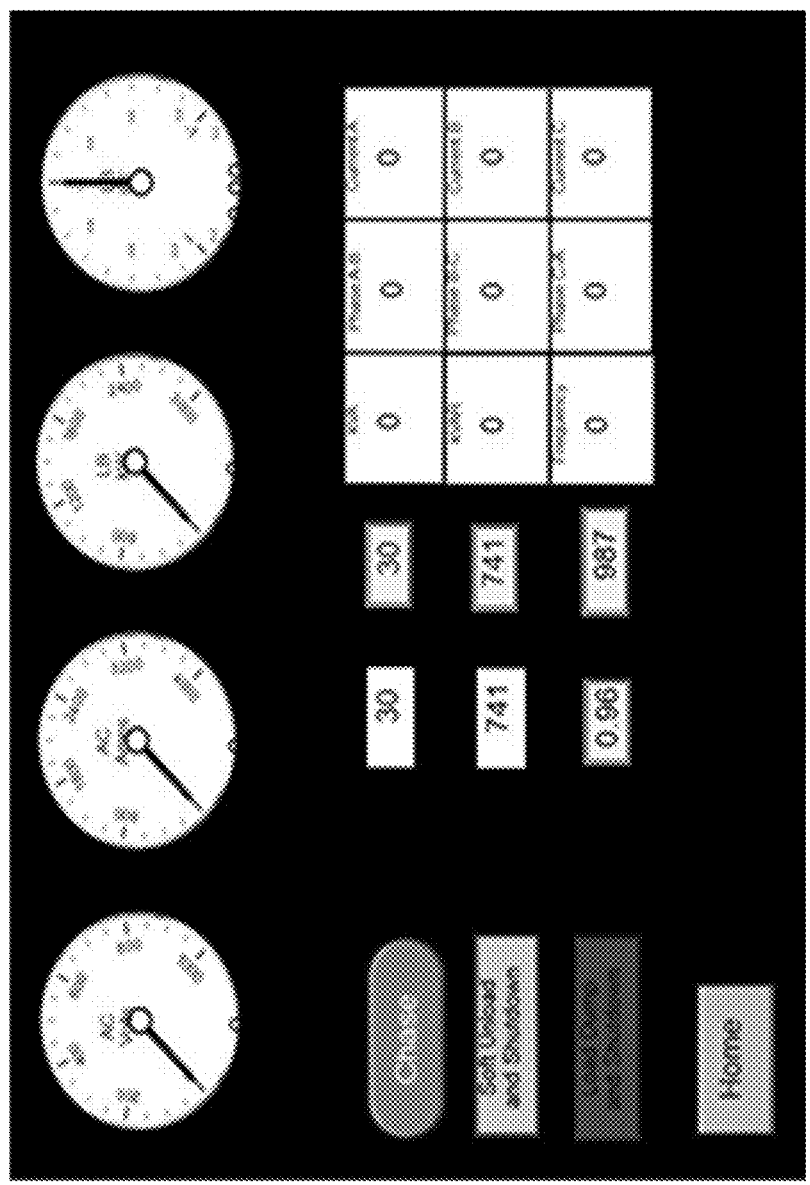

A load-chase mode can be selected by a user via the HMI home startup screen as depicted in FIG. 4. Once selected, the HMI can display the load-chase screen as depicted in FIG. 6. A user can enter a desired maximum inductive load to be applied curing the load-chase mode, and the user can select the "Load-Chase" button to activate the mode. The load bank module can apply a capacitive load and correct via an applied inductive load to preserve a desired lagging PF. The closer the PF comes to a leading value the more aggressively the load bank module can apply an inductive load. The load-chase mode can also include a "Soft Unload and Shutdown" and "Load Dump and Shutdown" actions similar to the "Auto-Load" function discussed above.

Timed Function

The timed mode can automatically apply different loads at set times over a 24 hour period to simulate time-of-use demand and accurately determine utility/PGS capability and health. The inclusion of a capacitive load bank coupled to the load bank module can effectively simulate many possible electrical demand/supply scenarios.

Capacitive Function

Figure 7:
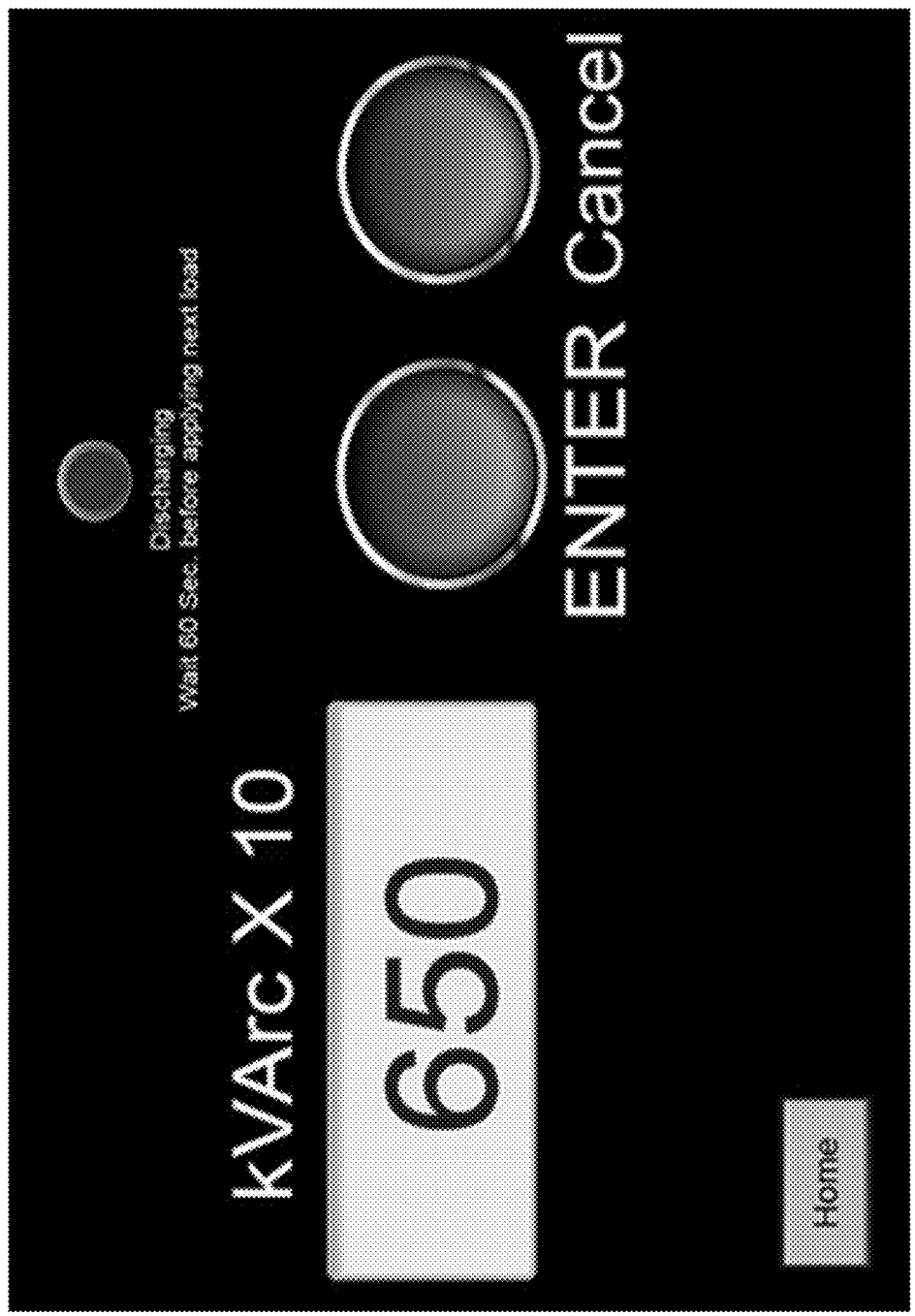

The load bank module can control a capacitive load bank by adjusting capacitive values automatically or manually to achieve power conditioning of a lagging PF. The Automatic mode is similar in operation to the Load Chase operation of the resistive/reactive mode. For example, the load bank module maintains set values input by the user and can then apply the calculated load on a preset interval. This mode can condition electricity with minimum capacitive burden. Further, the load bank module can adjust bus PF to maintain a lagging power factor negating the effects of harmonics and capacitance produced by data equipment. A capacitive mode screen displayed by the HMI is depicted in FIG. 7.

Simulated Failure Function

The load bank module can combine any inductive, capacitive, or resistive load values, and gradually or instantaneously applying these values to a coupled PGS. The load bank module can then identify points of failure in power generating abilities of the coupled PGS. In some cases, the simulated failure function can be initiated manually by a user.

Maintenance Function

The load bank module can also implement a maintenance function. For example, the load bank module can be coupled to a power generating device, such as an engine system for construction vehicles. The load bank module can identify and monitor various load parameters of the power generating device. For example, the load bank module can monitor resistive, capacitive inductive, values, power output, and the like.

Further, the load bank module can determine efficiency values of the power generator based on the monitored load parameters. For example, the load bank module can identify a variable threshold at least one of the variables monitored and discussed above. The threshold value, when met, can indicate a maintenance procedure is required. In some cases, the maintenance procedure is for the cleaning or replacing of a fuel filter.

Typically, when a fuel filter of a power generator requires maintenance, the power generator needs to be shut down and receive manual maintenance from a user. For example, the filter can be replaced, or in other cases, the power generator can apply a cleaning procedure to clean the filter, such as by increasing the temperature of the fluid filter to such a high degree that the particulates capture by the filter are burned off. However, even in this cleaning procedure scenario, the power generator will be shut down from operating due to the heavy load required to properly clean the filter.

According to the present disclosure, the load bank can identify when a filter can undergo a maintenance or cleaning procedure prior to the filter becoming so contaminated that the power generator needs to be shut down. The load bank module can accomplish this by monitoring the load parameters as discussed above, and also by identifying when a fuel filter of the power generator typically requires maintenance. For example, the load bank module can receive identification information of the power generator and/or fuel filter (e.g., via a MODBUS connection). From this information, the load bank module can determine an efficiency threshold of the power generator, that, when the monitored load parameters fall below the efficiency threshold, the fuel filter requires maintenance (e.g., at 50% efficiency). The load bank module can generate the maintenance threshold based off this efficiency threshold. For example, the maintenance threshold can be a percentage above the efficiency threshold (e.g., if the efficiency threshold is 50% power output, the maintenance threshold can be 10% above, or at 60% power output). Thus, the load bank module can identify when the fuel filter requires cleaning, but is not yet at the point where a user is required to step in and shut down the power generator.

When the load bank module identifies the monitored parameter(s) fall below the maintenance threshold, the load bank module can initiate a maintenance procedure. The maintenance procedure can include a cleaning procedure described above, albeit at a lower load requirement. For example, the power generator can heat the filter to a sufficient temperature to clean the filter. However, since the filter is not as contaminated as it would be had a cleaning procedure been typically performed, a lower temperature may be sufficient to clean the filter. Thus, in some cases, the power generator can also continue to operate at full capacity, or at a lower capacity, while simultaneously undergoing the maintenance procedure. The load bank module can further determine the load parameter requirements for the power generator to accomplish these simultaneous functions (e.g., a load value for the maintenance procedure and a load value for operating the power generator).

EQUIVALENTS

Although preferred embodiments of the invention have been described using specific terms, such description is for illustrative purposes only, and it is to be understood that changes and variations may be made without departing from the spirit or scope of the following claims.

INCORPORATION BY REFERENCE

The entire contents of all patents, published patent applications, and other references cited herein are hereby expressly incorporated herein in their entireties by reference.

The invention claimed is:

1. A method for controlling a load bank comprising:
receiving input via a human-machine interface (HMI) corresponding to desired operation for the load bank, the load bank being configured to apply a load to an electrical power source in accordance with a load test;
receiving data via a power quality analyzer, the data corresponding to a present operation of the load bank conveyed by values of load bank operating parameters of the load bank during the load test, the load bank operating parameters characterizing one or more of capacitance, reactance, or resistance of the load applied to the electrical power source by the load bank;
identifying a change in power demand on the electrical power source, the change in the power demand being caused by a third party during the load test;
determining that the change in the power demand on the electrical power source is unable to be met by virtue of the present operation of the load bank as measured via the one or more of the capacitance, the reactance, or the resistance of the load applied to the electrical power source by the load bank;
generating, based on the determining the change in the power demand on the electrical power source is unable to be met, a set of commands for dynamically adjusting the one or more of the capacitance, the reactance, or the resistance of the load applied to the electrical power source by the load bank to change the present operation of the load bank so that the change in the power demand on the electrical power source is able to be met;
monitoring, subsequent to sending the set of commands to the load bank, a set of bus power levels and a total power level for a predefined period of time; and
powering down the power quality analyzer if the set of bus power levels does not decrease.

2. The method of claim 1, wherein the input comprises a selection of a predetermined operating mode of the load bank.

3. The method of claim 2, wherein the input further comprises a load type, a number of increments for increasing or decreasing a load type, a time span for increasing or decreasing a load type, or a combination thereof.

4. The method of claim 1, further comprising:
powering the power quality analyzer after identifying a decrease in the total power level that exceeds a minimum power level threshold.

5. The method of claim 1, wherein the input comprises a selection of a predetermined operating mode from a set of available operating modes of the load bank.

6. The method of claim 1, wherein the input further comprises selection of the one or more of the capacitance, the reactance, or the resistance desired for the load during the load test.

7. The method of claim 6, further comprising:
calculating a load value based on the input; and
applying the load value on a preset interval.

8. The method of claim 1, further comprising:
adjusting a bus power factor level for implementing a lagging power factor according to the input.

9. The method of claim 1, further comprising:
adjusting the capacitance of the load bank for power conditioning a lagging power factor value.

10. The method of claim 1, wherein the set of commands further cause a set of power loads to be implemented by the load bank at predefined time intervals and in a predetermined order.

11. The method of claim 1, further comprising:
identifying points of failure of the load bank.

12. The method of claim 1, wherein the set of commands further dynamically adjust an inductance of the load.

13. The method of claim 1, wherein the third party comprises a data center, a hospital, a wind farm, a photovoltaic farm, a utility provider, a municipal building, or a combination thereof.

14. The method of claim 1, wherein the power quality analyzer communicates with the load bank via a MODBUS protocol.

15. The method of claim 1, further comprising:
classifying the change in the power demand on the electrical power source by the third party during the load test as an emergency condition.

16. The method of claim 15, wherein the set of commands cause the load bank to immediately shed some or all of the load.

17. A load bank module for controlling a load bank comprising:
a human-machine interface (HMI) configured to receive input corresponding to desired operation for the load bank, the load bank being configured to apply a load to an electrical power source in accordance with a load test;
a power quality analyzer in electronic communication with the HMI and the load bank, wherein the power quality analyzer is adapted and configured to:
receive data corresponding to a present operation of the load bank conveyed by values of load bank operating parameters of the load bank during the load test, the load bank operating parameters characterizing one or more of capacitance, reactance, or resistance of the load applied to the electrical power source by the load bank;
identify a change in power demand on the electrical power source, the change in the power demand being caused by a third party during the load test;
determine that the change in the power demand on the electrical power source is unable to be met by virtue of the present operation of the load bank as measured via the one or more of the capacitance, the reactance, or the resistance of the load applied to the electrical power source by the load bank;
generate, based on determining the change in the power demand by the electrical power source is unable to be met, a set of commands for dynamically adjusting the one or more of the capacitance, the reactance, or the resistance of the load applied to the electrical power source by the load bank to change the present operation of the load bank so that the change in the power demand on the electrical power source is able to be met;
monitor, subsequent to sending the set of commands to the load bank, a set of bus power levels and a total power level for a predefined period of time; and
power down the power quality analyzer if the set of bus power levels does not decrease.

18. The load bank module of claim 17, wherein the power quality analyzer is further adapted and configured to classify the change in the power demand on the electrical power source by the third party during the load test as an emergency condition.

19. The load bank module of claim 18, wherein the set of commands cause the load bank to immediately shed some or all of the load.

* * * * *